(12) United States Patent
Sumida

(10) Patent No.: US 12,069,814 B2
(45) Date of Patent: Aug. 20, 2024

(54) ELECTRONIC UNIT

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Tatsuya Sumida, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/754,690

(22) PCT Filed: Sep. 2, 2020

(86) PCT No.: PCT/JP2020/033198
§ 371 (c)(1),
(2) Date: Apr. 8, 2022

(87) PCT Pub. No.: WO2021/070523
PCT Pub. Date: Apr. 15, 2021

(65) Prior Publication Data
US 2024/0098910 A1  Mar. 21, 2024

(30) Foreign Application Priority Data
Oct. 11, 2019 (JP) .................. 2019-187756

(51) Int. Cl.
*H05K 5/00* (2006.01)
*B60R 16/02* (2006.01)

(52) U.S. Cl.
CPC ............ *H05K 5/0069* (2013.01); *B60R 16/02* (2013.01)

(58) Field of Classification Search
CPC .. H05K 5/0069; H05K 5/0017; H05K 5/0217; G06F 1/184–185
(Continued)

(56) References Cited

U.S. PATENT DOCUMENTS 11,051,420 B1 * 6/2021 Uchida ................ H05K 7/1427
2005/0105253 A1  5/2005 Sakai
(Continued)

FOREIGN PATENT DOCUMENTS

| JP | 2009-290943 A | 12/2009 |
| JP | 2017-117893 A | 6/2017 |
| JP | 2019-71376 A | 5/2019 |

OTHER PUBLICATIONS

International Search Report, Application No. PCT/JP2020/033198, mailed Nov. 24, 2020. ISA/Japan Patent Office.

*Primary Examiner* — Hung S. Bui
(74) *Attorney, Agent, or Firm* — Honigman LLP

(57) ABSTRACT

An electronic unit includes: a case; a circuit board; and a cover, wherein a portion of a connector, which is provided on the circuit board, to be connected to a mating connector is exposed to the outside through a through hole of the cover, a first clearance portion and a second clearance portion are provided in at least one of a portion located between the cover and the case at a position of the opening and a portion located between the cover and the connector at a position of the through hole, a clearance in the first clearance portion is larger than a clearance in the second clearance portion, the second clearance portion is located on an inner side of the case relative to the first clearance portion, and the first clearance portion extends and reaches the second clearance portion while maintaining a constant clearance.

11 Claims, 9 Drawing Sheets

(58) Field of Classification Search
USPC ........ 361/752, 796, 800, 728, 807, 809, 810
See application file for complete search history.

(56) References Cited

U.S. PATENT DOCUMENTS

| | | | |
|---|---|---|---|
| 2009/0075501 A1* | 3/2009 | Honda | H05K 5/0039 |
| | | | 439/78 |
| 2015/0077956 A1 | 3/2015 | Sano | |
| 2017/0257959 A1 | 9/2017 | Ogitani | |
| 2019/0380215 A1* | 12/2019 | Tsujiya | H05K 5/0039 |
| 2020/0120816 A1* | 4/2020 | Imaizumi | H05K 5/0069 |

* cited by examiner

ELECTRONIC UNIT

CROSS-REFERENCE TO RELATED APPLICATIONS

This application is the U.S. national stage of PCT/JP2020/033198 filed on Sep. 2, 2020, which claims priority of Japanese Patent Application No. JP 2019-187756 filed on Oct. 11, 2019, the contents of which are incorporated herein.

TECHNICAL FIELD

The present disclosure relates to an electronic unit.

BACKGROUND ART

JP 2015-60708A discloses a vehicle electronic control unit that suppresses wetting of a circuit board by discharging water droplets that have entered the case thereof. In JP 2015-60708A, a diffusion pocket is formed in the case so as to diffuse water droplets that have entered the case.

However, in the technique disclosed in JP 2015-60708A, the amount of protrusion of a connector in the horizontal direction with respect to a circuit board is increased by the size of the diffusion pocket, and there is the possibility of the size of the electronic control unit increasing.

Accordingly an object of the present disclosure is to provide a technique capable of increasing waterproofness of an electronic unit while making the electronic unit as compact as possible.

SUMMARY

An electronic unit according to the present disclosure includes: a case including an opening; a circuit board housed in the case; and a cover attached to the opening, wherein a connector is provided on the circuit board, a through hole is formed in the cover, a portion of the connector to be connected to a mating connector is exposed to the outside through the through hole, a first clearance portion and a second clearance portion are provided in at least one of a portion located between the cover and the case at a position of the opening and a portion located between the cover and the connector at a position of the through hole, a clearance in the first clearance portion is larger than a clearance in the second clearance portion, the second clearance portion is located on an inner side of the case relative to the first clearance portion, and the first clearance portion extends and reaches the second clearance portion while maintaining a constant clearance.

Advantageous Effects

According to the present disclosure, it is possible to increase waterproofness of an electronic unit while making the electronic unit as compact as possible.

DETAILED DESCRIPTION OF PREFERRED EMBODIMENTS

Figure 1:
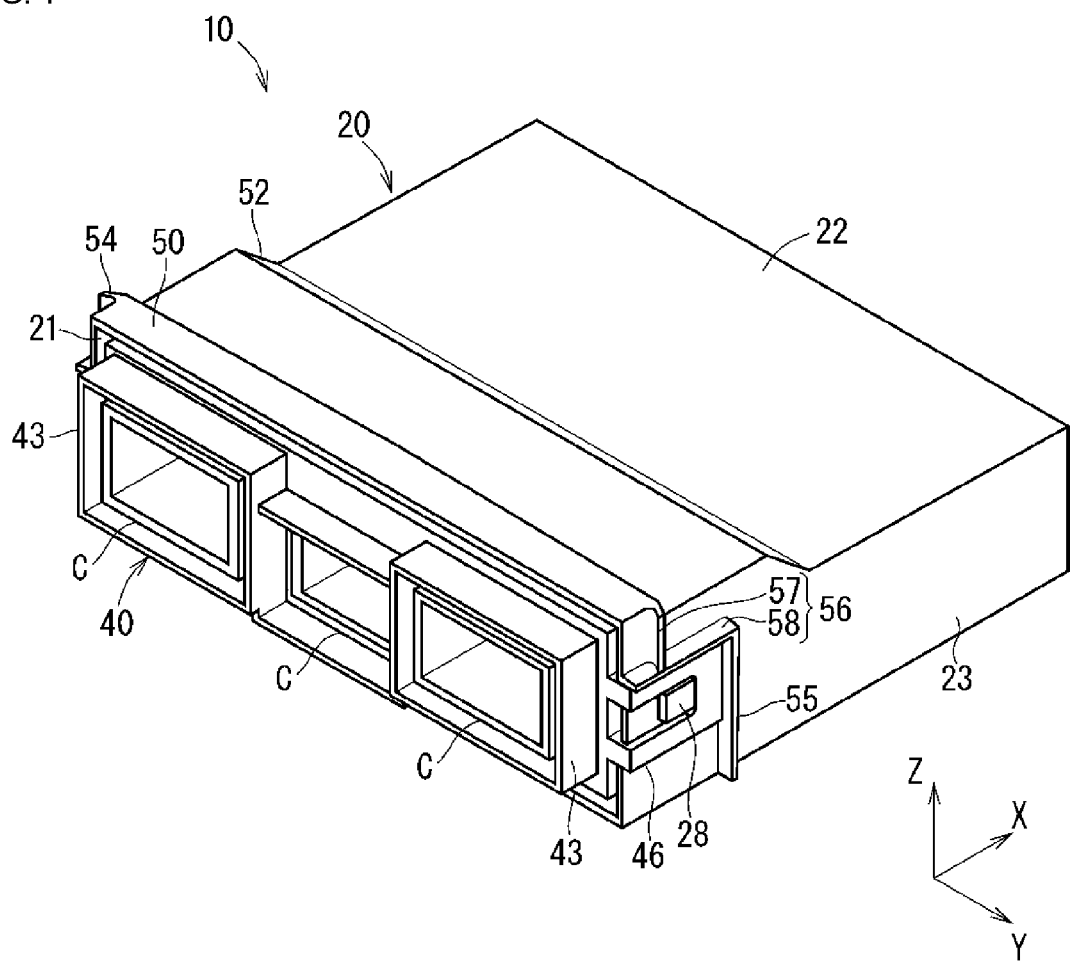
FIG. 1 is a perspective view showing an electronic unit according to an embodiment.

First, embodiments of the present discloser will be listed and described.

An electronic unit according to the present disclosure is described as follows.

An electronic unit according to the present discloser includes: a case including an opening; a circuit board housed in the case; and a cover attached to the opening, wherein a connector is provided on the circuit board, a through hole is formed in the cover, a portion of the connector to be connected to a mating connector is exposed to the outside through the through hole, a first clearance portion and a second clearance portion are provided in at least one of a portion located between the cover and the case at a position of the opening and a portion located between the cover and the connector at a position of the through hole, a clearance in the first clearance portion is larger than a clearance in the second clearance portion, the second clearance portion is located on an inner side of the relative to the first clearance portion, and the first clearance portion extends and reaches the second clearance portion while maintaining a constant clearance. Because the first clearance portion having a large clearance is located on the outer side, water is less likely to reach the second clearance portion even if a capillary phenomenon occurs, and thus entry of water into the case can be prevented. In addition, because the first clearance portion extends and reaches the second clearance portion while maintaining the constant clearance, there is no need to provide a water pooling portion between the first clearance portion and the second clearance portion, and thus the electronic unit can be kept compact. As a result, it is possible to increase waterproofness of the electronic unit while making the electronic unit as compact as possible.

The first clearance portion and the second clearance portion may be provided in the portion located between the cover and the case at the position of the opening. With this configuration, it is possible to prevent water from entering the case through a gap between the cover and the case.

The first clearance portion and the second clearance portion may be provided in the portion located between the cover and the connector at the position of the through hole. With this configuration, it is possible to prevent water from entering the case through a gap between the cover and the connector.

The opening may be formed to have a size into which the circuit board is insertable, the case may be formed in a rectangular parallelepiped box shape, and the opening may be formed in a portion corresponding to one surface of the rectangular parallelepiped. With this configuration, it is possible to reduce the region of the case in which the opening is provided.

When a rising height of a liquid level is defined as an assumed height regarding a capillary phenomenon caused by a combination of water and a circular tube having a diameter of the constant clearance, the first clearance portion extends to the second clearance portion by the assumed height or more while maintaining the constant clearance. With this configuration, even if water enters the first clearance portion and a capillary phenomenon occurs, the water is less likely to reach the second clearance portion.

Specific examples of the electronic unit according to the present disclosure will be described below with reference to the drawings. The present disclosure is not limited to these examples, but is indicated by the scope of claims and is intended to include all modifications within the meaning and range equivalent to the scope of claims.

EMBODIMENT

Figure 2:
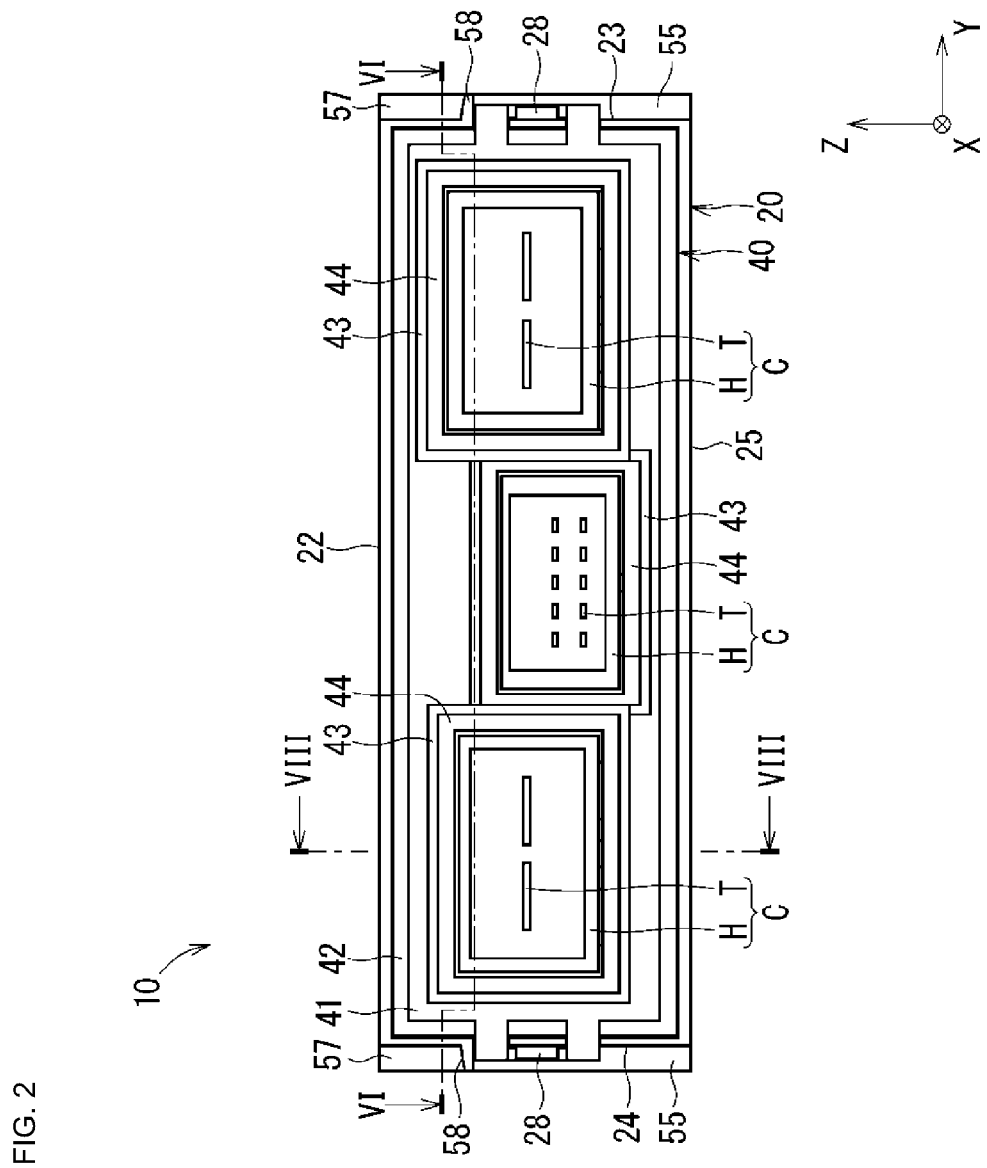
FIG. 2 is a front view showing the electronic unit according to the embodiment.
Figure 3:
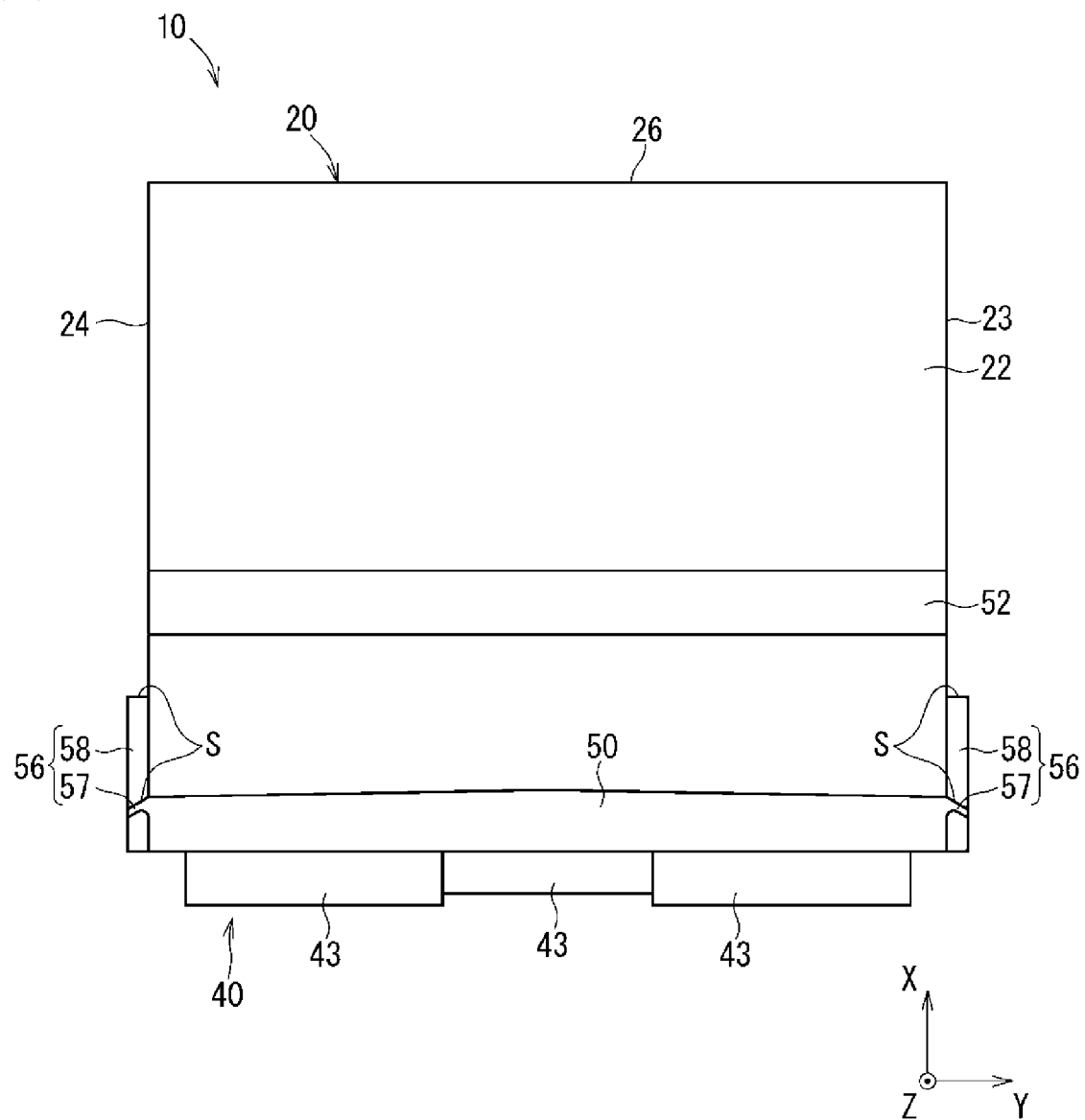
FIG. 3 is a plan view showing the electronic unit according to the embodiment.
Figure 4:
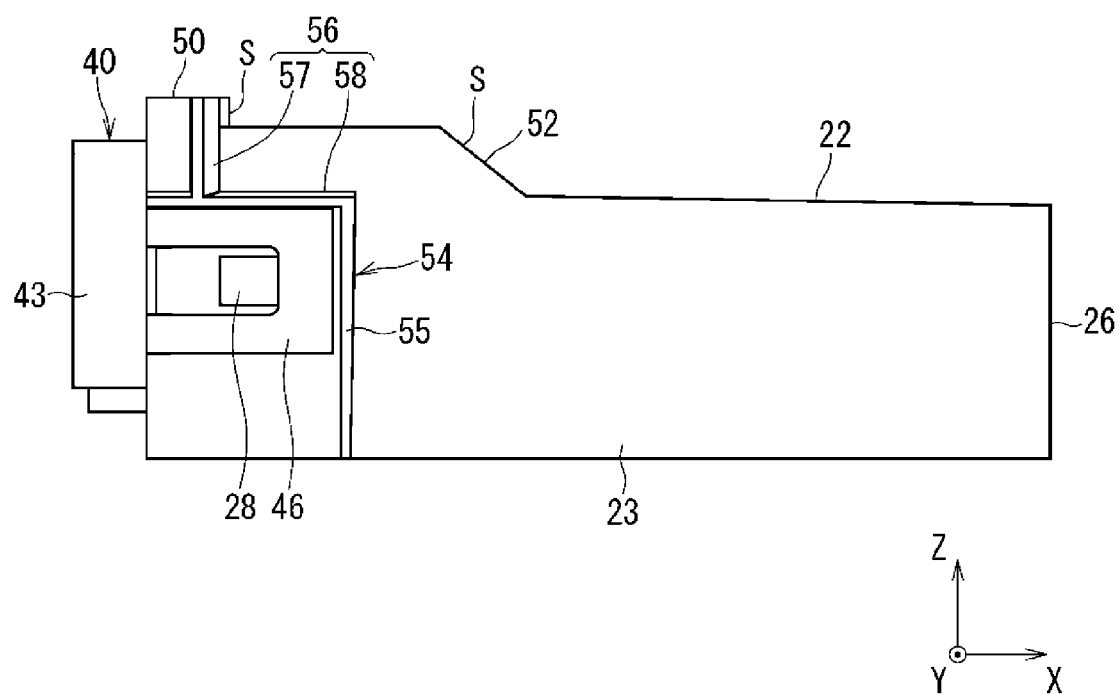
FIG. 4 is a side view showing the electronic unit according to the embodiment.
Figure 5:
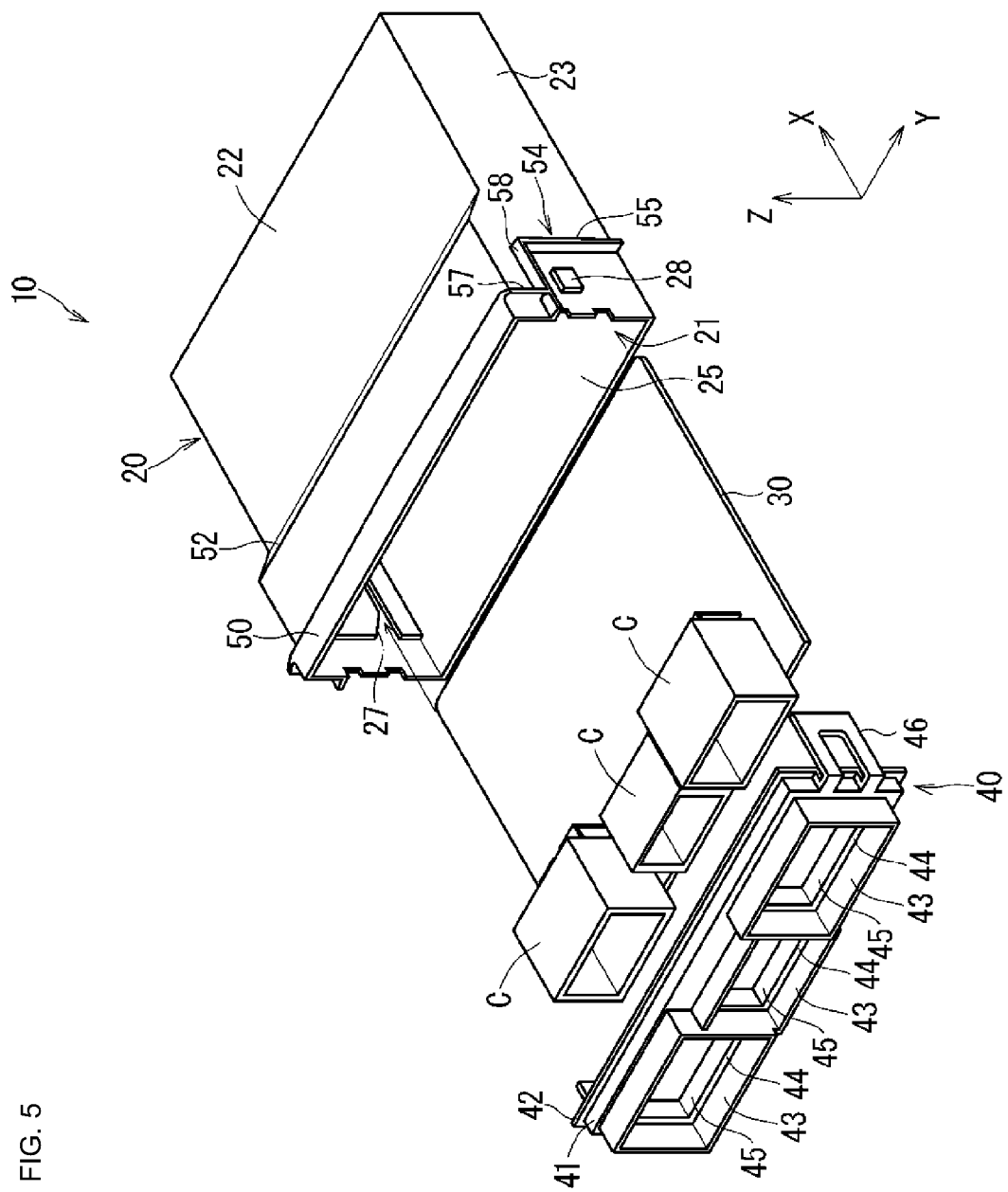
FIG. 5 is an exploded perspective view showing the electronic unit according to the embodiment.
Figure 6:
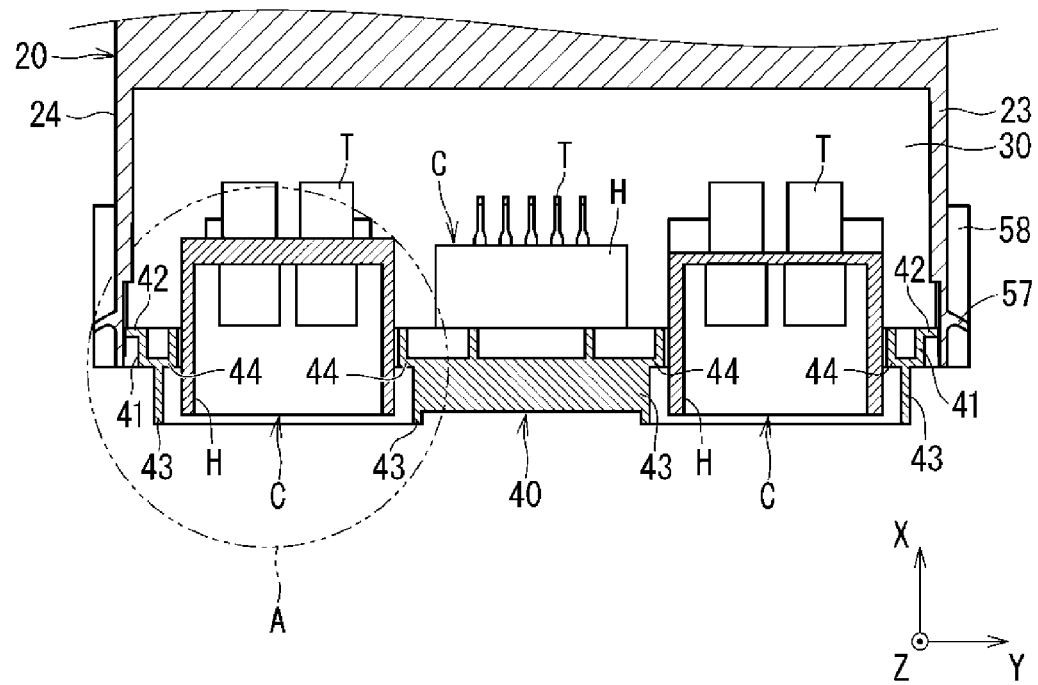
FIG. 6 is a cross-sectional view taking along line VI-VI of FIG. 2.
Figure 7:
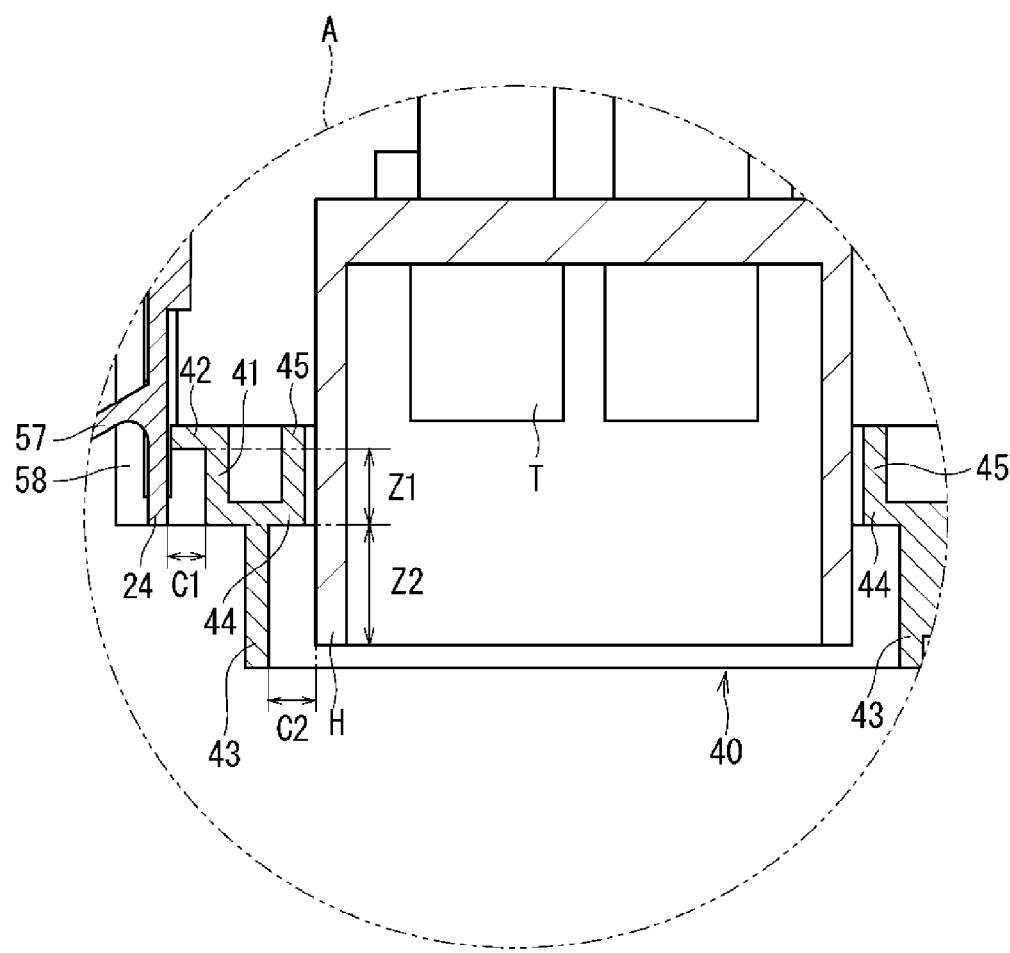
FIG. 7 is an enlarged view of a region A in FIG. 6.
Figure 7:
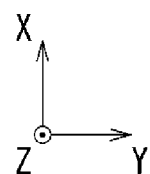
Figure 8:
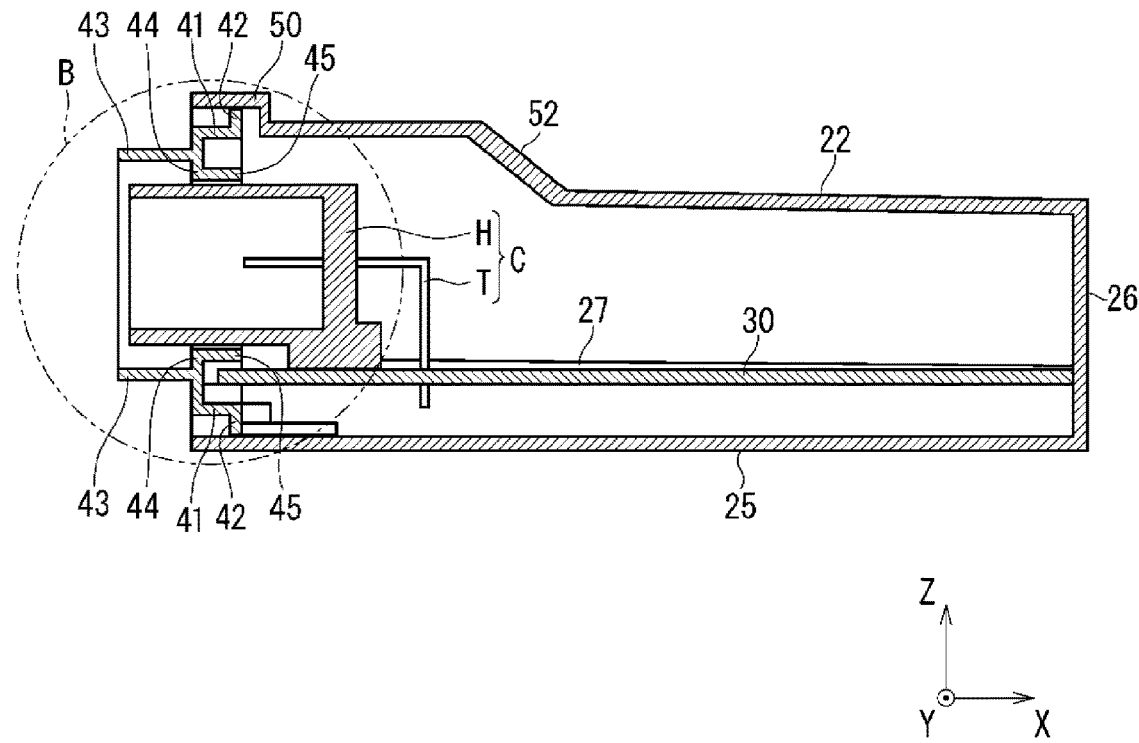
FIG. 8 is a cross-sectional view taking along line VIII-VIII of FIG. 2.
Figure 9:
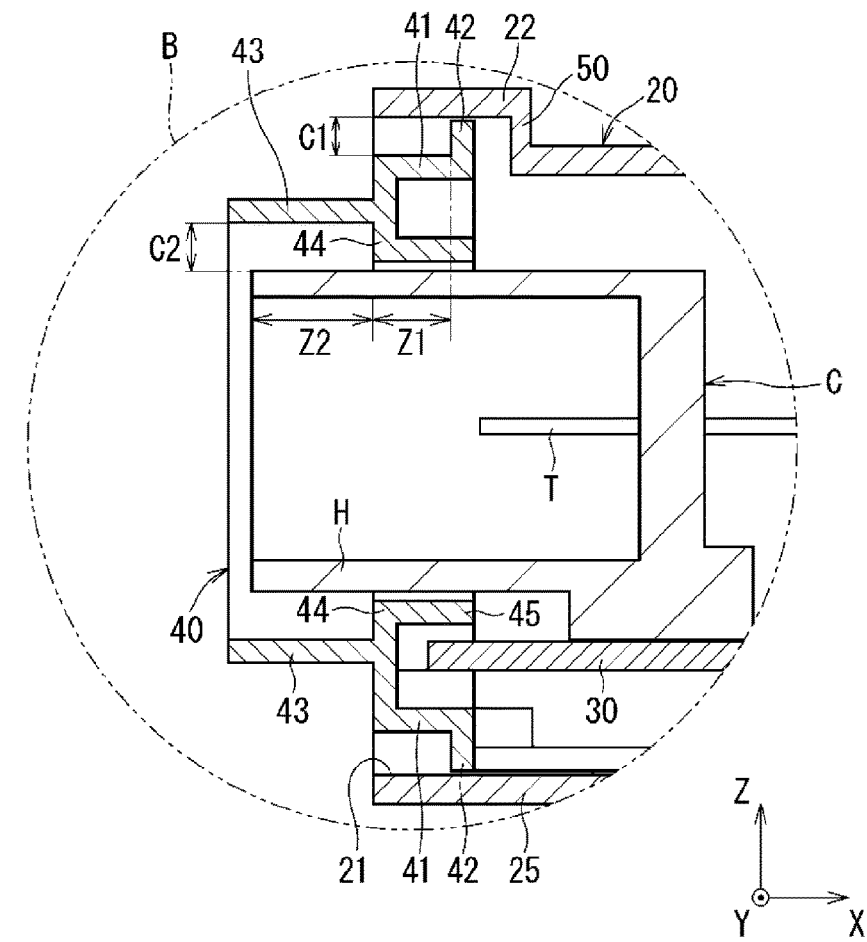
FIG. 9 is an enlarged view of a region B in FIG. 8.

Hereinafter, an electronic unit according to an embodiment will be described. FIG. 1 is a perspective view showing an electronic unit 10 according to the embodiment. FIG. 2 is a front view showing the electronic unit 10 according to the embodiment. FIG. 3 is a plan view showing the electronic unit 10 according to the embodiment. FIG. 4 is a side view showing the electronic unit 10 according to the embodiment. FIG. 5 is an exploded perspective view showing the electronic unit 10 according to the embodiment. FIG. 6 is a cross-sectional view taking along line VI-VI of FIG. 2. FIG. 7 is an enlarged view of a region A in FIG. 6. FIG. 8 is a cross-sectional view taking along line VIII-VIII of FIG. 2. FIG. 9 is an enlarged view of a region B in FIG. 8.

The electronic unit 10 includes a case 20, a circuit board 30, and a cover 40. The electronic unit 10 is used, for example, as an electronic control unit. The electronic unit 10 is installed in a vehicle or the like. It is assumed that the electronic unit 10 is disposed in a place where it is relatively unlikely to be splashed with water, for example, in a vehicle interior.

The case 20 includes an opening 21. The case 20 is formed in a rectangular parallelepiped box shape. A portion corresponding to one surface of the six surfaces of the rectangular parallelepiped is the opening 21. Of the six surfaces of the rectangular parallelepiped, four surfaces surrounding the opening 21 are side walls 22, 23, 24, and 25. The side wall 22 corresponds to a first side wall 22. The side walls 23 and 24 correspond to second side walls 23 and 24. Of the six surfaces of the rectangular parallelepiped, the surface located on the opposite side to the opening 21 is a bottom wall 26. Hereinafter, in this specification, a direction connecting the opening 21 and the bottom wall 26 is referred to as an X direction. The X direction is an insertion direction of the circuit board 30. Two directions orthogonal to the X direction are referred to as a Y direction and a Z direction. The Y direction extends parallel to the side walls 22 and 25. The Z direction extends parallel to the side walls 23 and 24.

The circuit board 30 is housed in the case 20 through the opening 21. Electronic components may be mounted on the circuit board 30. The circuit board may have one, two, or three or more layers. Connectors C are provided on the circuit board 30. The entirety of the circuit board 30 extending along the X direction is housed in the case 20.

Each connector C includes a connector housing H and terminals T. The connector housing H is mounted on the circuit board 30. Apart of the connector housing H protrudes outward from the circuit board 30 along the X direction. A part of the connector housing H protrudes outward from the case 20 along the X direction. A mating connector is to be connected to the protrusion portion. A recessed portion is formed in the protrusion portion. The mating connector is to be inserted into the recessed portion. One end portion of each of the terminals T is connected to a circuit formed on the circuit board 30. The other end portion of each of the terminals T protrude into a recessed portion. In a state in which the mating connector is inserted into the recessed portion, the other end portions of the terminals T are connected to mating terminals provided on the mating connector.

A positioning portion for positioning the circuit board 30 may be provided on the inner surface of the case 20. In FIG. 5, for example, guide portions 27 are illustrated as the positioning portions. The guide portions 27 are formed on inner surfaces of the side walls 23 and 24, respectively. Each guide portion 27 is formed in a groove shape that extends in the X direction. The circuit board 30 that is inserted into the case 20 from the opening 21 is guided by the guide portions 27, and housed in the case 20. In a state where the circuit board 30 is housed in the case 20, the guide portions 27 are formed so as to support the side edges of the circuit board 30. Alternatively, as a positioning portion, a protruding portion may be provided on one of the inner surface of the case 20 and the circuit board 30, and a recessed portion into which the protruding portion is to be fitted may be provided on the other of the inner surface of the case 20 and the circuit board 30.

Locking portions 28 for locking the cover 40 are provided on the outer surface of the case 20. In this embodiment, the locking portions 28 are provided on the outer surfaces of the side walls 23 and 24, respectively. The locking portions 28 are each formed in a protruding shape respectively protruding from the outer surfaces of the side walls 23 and 24. The cover 40 is hooked and locked to the locking portions 28.

The cover 40 is attached to the opening 21. The cover 40 includes a frame portion 41, an outward flange 42, hoods 43, and inward flanges 44. The cover 40 further includes ribs 45 and locking pieces 46.

The frame portion 41 is inserted into the case 20 through the opening 21. The frame portion 41 is formed in a shape that matches the inner peripheral surface of a peripheral edge portion of the opening 21. Because the side walls 22, 23, 24, and 25 serve as the peripheral edge portion of the opening 21, the frame portion 41 is formed in a rectangular parallelepiped tubular shape that corresponds to the inner surface shape formed by the side walls 22, 23, 24, and 25. The outer surface of the frame portion 41 is provided so as to face the inner surfaces of the side walls 22, 23, 24, and 25 with a gap therebetween.

The outward flange 42 protrudes from the frame portion 41 toward the inner surface of the case 20. The outward flange 42 is connected to one end portion of the frame portion 41 located on the rear side of the case 20. The outward flange 42 closes off the gap between the frame portion 41 and the case 20.

The hoods 43 are formed so as to surround the respective connector housings H. In this example, three connectors C are provided. Three hoods 43 are also provided so as to surround the three connector housings H. Each hood 43 is connected to the other end portion of the frame portion 41. The hoods 43 protrude from the frame portion 41 to the outside of the case 20 along the X direction. Each hood 43 has an inner surface that corresponds to the outer surface of the connector housing H. Here, because the outer surface of each connector housing H is formed in a rectangular shape, the hoods 43 are formed in a rectangular parallelepiped tubular shape. One end of each hood 43 protrudes outward from the connector housing H along the X direction. Portions surrounded by the hoods 43 serve as through holes.

Portions of the connectors C to be connected to the mating connectors are exposed to the outside through the through holes.

The inward flanges 44 protrude from the hoods 43 toward the outer surfaces of the connector housings H. Each inward flange 44 is connected to an end portion of the hood 43 located on the rear side of the case 20. Portions connecting the frame portion 41 and the hoods 43 are provided on the opposite sides of the inward flanges 44 with respect to the hoods 43. The frame portion 41 is connected to extended portions of the inward flanges 44. The ribs 45 are provided at end portions of the inward flanges 44, respectively. The inward flanges 44 close off gaps between the hoods 43 and the connector housings H.

The ribs 45 protrude from the distal end portions of the inward flanges 44 toward the rear side of the case 20. The ribs 45 surround the connector housings H, respectively. Furthermore, the ribs 45 are provided so as to face the frame portion 41. Each rib 45 has the same depth as that of the frame portion 41. On the side wall 25 side, an end portion of the circuit board 30 on the opening 21 side is housed between the frame portion 41 and the ribs 45. Holding portions that hold an end portion of the circuit board 30 may be provided between the frame portion 41 and the ribs 45. With this configuration, the end portion of the circuit board 30 on the opening 21 side is supported.

The locking pieces 46 are provided on the outer side of the frame portion 41. The locking pieces 46 protrude from the frame portion 41. Each locking piece 46 includes a first piece and second piece. The first piece protrudes from the frame portion 41 along the Y direction. The second piece protrudes from the distal end of the first piece along the X direction. The second pieces face the side walls 23 and 24, respectively. A locking recessed portion is formed in each second piece. When the locking portions 28 are housed in the locking recessed portions, the locking pieces 46 are hooked and locked to the locking portions 28.

The locking recessed portion is formed in a region spanning from the first piece to an intermediate portion of the second piece. With this configuration, two L-shaped pieces are parallel to each other between the first piece and the intermediate portion of the second piece. Positioning recessed portions for positioning the two L-shaped pieces are formed on the peripheral edge of the opening 21, in the side walls 23 and 24, respectively.

In the electronic unit of the present disclosure, water flowing along the outer surface of the case 20 is prevented from entering the case 20 by protruding portions 50, 52, and 54 provided on the side walls 22, 23, and 24 and the clearances that are set in the cover 40.

Protruding Portions

First, the protruding portions 50, 52, and 54 will be described. The protruding portions 50, 52, and 54 are provided to prevent water from reaching a gap between the cover 40 and the case 20, gaps between the cover 40 and the connector housings H, and the like. In this example, the side wall 22 is provided with a plurality of protruding portions 50 and 52. Also, the side walls 23 and 24 are each provided with the protruding portion 54. The protruding portions 50, 52, and 54 each include a step S that causes corresponding portions of the side walls 22, 23, and 24 on the opening 21 side to protrude outward relative to portions on the rear side thereof. The protruding portions 50, 52, and 54 are provided so as to extend along the periphery of the opening 21.

A plurality of (in this example, two) protruding portions 50 and 52 are provided on the side wall 22 from the rear side portion to the opening 21 side portion. The plurality of protruding portions 50 and 52 are provided at an interval in the X direction. Of the plurality of protruding portions 50 and 52, the protruding portion located closest to the opening 21 is referred to as an opening-side protruding portion 50. In contrast, of the plurality of protruding portions 50 and 52, the protruding portion located farther from the opening 21 than the opening-side protruding portion 50 is referred to as a rear-side protruding portion 52.

In the opening-side protruding portion 50, a shape where the opening 21 side protrudes outward from the step S continues to the opening 21 side along the X direction. An inner surface of a portion of the side wall 22 where the opening-side protruding portion 50 is formed is also stepped. With this configuration, the housing space in the case 20 is increased at the portion where the opening-side protruding portion 50 is formed. The cover 40 is housed in this enlarged housing space. Accordingly, the opening-side protruding portion 50 also has a function of increasing the housing space in the case 20 for housing the cover 40.

Similarly, also, in the rear-side protruding portion 52, a shape where the opening 21 side protrudes outward from the step S continues to the opening 21 side along the X direction. An inner surface of a portion of the side wall 22 where the rear-side protruding portion 52 is formed is also stepped. With this configuration, the housing space in the case 20 is increased at the portion where the rear-side protruding portion 52 is formed. The connector housings H are housed in this enlarged housing space. Accordingly, the rear-side protruding portion 52 also has a function of increasing the housing space in the case 20 for housing the connector housings H.

In the surface of the opening-side protruding portion 50 facing the X direction, the intermediate portion extending in the Y direction protrudes the most in the X direction. The surface of the opening-side protruding portion 50 facing the X direction is inclined so as to gradually approach the opening 21 side from the intermediate portion extending in the Y direction toward the end portions in the Y direction. With this configuration, water that hits the surface of the opening-side protruding portion 50 facing the X direction is likely to be guided to the end portions in the Y direction.

The surface of the opening-side protruding portion 50 facing the X direction is orthogonal to the XY plane. In contrast, the surface of the rear-side protruding portion 52 facing the X direction forms an angle smaller than 90 degrees with respect to the XY plane. Of course, the surface of the opening-side protruding portion 50 facing the X direction may form an angle smaller than 90 degrees with respect to the XY plane. In contrast, the surface of the rear-side protruding portion 52 facing the X direction may be orthogonal to the XY plane.

The protruding portions 54 on the side walls 23 and 24 each have a first band-shaped protruding portion 55 and a second band-shaped protruding portion 56. The first band-shaped protruding portion 55 and the second band-shaped protruding portion 56 are formed in a band shape. The first protruding portion 55 and the second band-shaped protruding portion 56 are formed so as to protrude outward from portions where the first band-shaped protruding portion 55 and the second band-shaped protruding portion 56 are located.

The first band-shaped protruding portion 55 is provided so as to extend along the circumferential direction of the opening 21 at a position farther from the opening 21 than the locking portion 28 is. The first band-shaped protruding portions 55 are provided so as to protrude more outward of the second side walls 23 and 24 than the locking portions 28.

The first band-shaped protruding portions 55 are provided so as to protrude more in the Y direction than the locking portions 28. The first band-shaped protruding portions 55 are provided, along the X direction, at positions farther from the opening 21 than the opening-side protruding portion 50 is. In other words, the opening-side protruding portion 50 is provided, along the X direction, at a position closer to the opening 21 than the first band-shaped protruding portions 55 are. The first band-shaped protruding portions 55 extend along the Z direction. One end portion of each of the first band-shaped protruding portions 55 reaches the side wall 25. The other end portions of the first band-shaped protruding portions 55 extend to intermediate portions of the side walls 22 and 23, respectively. The positions of the other end portions of the first band-shaped protruding portions 55 with respect to the side wall 25 along the Z direction are located at positions that are the same as or farther from the position of a portion of the side wall 22 that is on the rear side of the rear-side protruding portion 52 with respect to the side wall 25.

The second band-shaped protruding portions 56 connect the opening-side protruding portion 50 and the first band-shaped protruding portions 55. The second band-shaped protruding portions 56 each have a first section 57 and a second section 58.

The first section 57 extends in the Z direction. The first section 57 is provided at a position along the X direction separated from the first band-shaped protruding portion 55. The first section 57 is provided at a position along the X direction close to the opening 21 relative to the first band-shaped protruding portion 55. The first section 57 extends parallel to the first band-shaped protruding portion 55. One end portion of the first section 57 is continuous with the opening-side protruding portion 50. The other end portion of the first section 57 is located at the same position located along the Z direction as the other end portion of the first band-shaped protruding portion 55.

The second section 58 connects the first band-shaped protruding portion 55 and the first section 57. The second section 58 extends in the X direction. One end portion of the second section 58 is continuous with the other end portion of the first band-shaped protruding portion 55. The other end portion of the second section 58 reaches the opening 21. The other end portion of the first section 57 is continuous with an intermediate portion of the second section 58.

The first band-shaped protruding portions 55 and the second band-shaped protruding portions 56 respectively partition the second side walls 23 and 24 into an opening-side region and a rear-side region. The opening-side region is a region on the side where the locking portion 28 is located. The rear-side region is a region on the side continuous with the bottom wall 26. Surfaces of the first band-shaped protruding portion 55 and the second band-shaped protruding portion 56 facing the rear-side region side are inclined surfaces. The inclined surfaces are inclined from the proximal ends connected to the second side walls 23 and 24 toward the distal ends so as to be distanced from the rear-side regions.

Specifically, the surface of the first band-shaped protruding portion 55 facing the rear side (positive side in the X direction) is an inclined surface. In addition, the surface of the first section 57 facing the rear side (positive side in the X direction) is an inclined surface. The inclined surface of the first band-shaped protruding portion 55 and the inclined surface of the first section 57 are inclined toward the negative side in the X direction, as the inclined surfaces protrude from each of the side walls 23 and 24 along the Y direction. The surface of the second section 58 facing the side of the side wall 22 (positive side in the Z direction) is an inclined surface. The inclined surface of the second sections 58 is inclined toward the negative side in the Z direction, as the inclined surface protrudes from each of the side walls 23 and 24 along the Y direction.

Clearances

Next, the clearances will be described. Due to the clearances set in the cover 40, even if water reaches a gap between the cover 40 and the case 20 or a gap between the cover 40 and the connectors C, water is less likely to enter the case 20.

In this example, a first clearance portion and a second clearance portion are provided in a portion located between the cover 40 and the case 20 at the position of the opening 21 and portions respectively located between the cover 40 and the connectors C at the positions of the through holes.

Between the cover 40 and the case 20 at the position of the opening 21, the first clearance portion is formed between the outer surface of the frame portion 41 and the inner surface of the case 20. In addition, the second clearance portion is formed between the outer surface of the outward flange 42 and the inner surface of the case 20.

Between the cover 40 and the connectors C at the positions of the through holes, the first clearance portions are formed between the inner surfaces of the hoods 43 and the outer surfaces of the connector housings H. In addition, portions between the inner surface of the inward flange 44 and the outer surfaces of the connector housings H serve as second clearance portions.

The clearance in the first clearance portion is larger than the clearance in the second clearance portion. In addition, the second clearance portion is located further inside the case 20 than the first clearance portion. The first clearance portion extends to reach the second clearance portion, while maintaining a constant clearance. In this example, when a rising height of a liquid level is assumed to be an assumed height in a capillary phenomenon caused by a combination of water and a circular tube having a diameter of a certain clearance in the first clearance portion, the first clearance portion extends to the second clearance portion by the assumed height or more while maintaining the constant clearance.

Specifically, in FIGS. 7 and 9, the dimension C1 is a distance between the outer surface of the frame portion 41 and the inner surface of the case 20. The dimension C1 is a clearance in the first clearance portion between the cover 40 and the case 20. The dimension Z1 is a dimension extending along the X direction (depth direction) of a portion where the outer surface of the frame portion 41 and the inner surface of the case 20 face each other. The dimension Z1 is a dimension of a portion where the constant clearance continues in the first clearance portion between the cover 40 and the case 20. The dimension C1 and the dimension Z1 are determined according to the following Expression (1).

Expression (1)

$$Z = \frac{2T\cos\Theta}{\rho g r} \quad (1)$$

Here, Expression (1) is an expression representing a liquid level height when a capillary phenomenon occurs in a circular tube. Z in Expression (1) is a liquid level height (m). T is the surface tension (N/m). $\Theta$ is the contact angle (rad). $\rho$ is the density of the liquid (kg/m3). g is gravity acceleration (m/s2). r is the radius (m) of the circular tube. In Expression (1), the liquid level height Z is inversely proportional to the radius r of the circular tube. T and ρ are values specific to a liquid. Θ is a value determined by the material forming the circular tube and the liquid. Accordingly, when the types of the material forming the circular tube and the liquid are determined, the variables are only Z and r.

The value of Z1 is set to, for example, a value larger than or equal to the value of Z obtained when the value of one half of C1 is substituted for the value of r in Expression (1). C1 and Z at this time may be determined experimentally. In other words, the value of Z1 is set to a value greater than or equal to the value of Z obtained when experimenting with water and a circular tube having a radius of one half of the value of C1. At this time, the value of Z may be obtained in each of two cases, that is to say, a case where the circular tube is made of the material forming the cover 40 and a case where the circular tube is made of the material forming the case 20. In this case, the value of Z1 may be greater than or equal to the larger value of the two values of Z, greater than or equal to the smaller value of the two values of Z, or greater than or equal to the average value of the two values of Z.

By setting the values of C1 and Z1 in this manner, water that has entered between the outer surface of the frame portion 41 and the inner surface of the case 20 is less likely to enter the case 20, even if a capillary phenomenon occurs.

Furthermore, when a gap between the outer surface of the frame portion 41 and the inner surface of the case 20 is large, there is a possibility that dust, dirt, or the like will enter the case 20 through the gap. However, because the outward flange 42 is provided, dust, dirt, or the like passing through the gap between the outer surface of the frame portion 41 and the inner surface of the case 20 is prevented from entering the case 20. Also, even if a capillary phenomenon occurs, water that has entered between the outer surface of the frame portion 41 and the inner surface of the case 20 is less likely to reach the outward flange 42. For this reason, even in a case where the outward flange 42 is provided as in this example, even if there is a small gap between the outer surface of the outward flange 42 and the inner surface of the case 20, water is less likely to reach the gap, and thus water is less likely to enter the case 20 through the gap.

Similarly, in FIGS. 7 and 9, the dimension C2 is a distance between the inner surface of the hood 43 and the outer surface of the connector housing H. The dimension C2 is a clearance in the first clearance portion between the cover 40 and the connector C. The dimension Z2 is a dimension extending along the X direction (depth direction) of a portion where the inner surface of the hood 43 and the outer surface of the connector housing H face each other. The dimension Z2 is a dimension of a portion where the constant clearance continues in the first clearance portion between the cover 40 and the connector C. The dimension C2 and the dimension Z2 are also determined according to the above Expression (1).

The value of Z2 is set to, for example, a value larger than or equal to the value of Z obtained when the value of one half of C2 is substituted for the value of r in Expression (1). C2 and Z at this time may be determined experimentally. In other words, the value of Z2 is set to a value greater than or equal to the value of Z obtained when experimenting with a circular tube having a radius of one half of the value of C2. At this time, the value of Z may be obtained in each of two cases, that is to say, a case where the circular tube is made of the material forming the cover 40 and a case where the circular tube is made of the material forming the connector housing H. In this case, the value of Z2 may be greater than or equal to the larger value of the two values of Z, greater than or equal to the smaller value of the two values of Z, or greater than or equal to the average value of the two values of Z.

By setting the values of C2 and Z2 in this manner, water that has entered between the inner surface of the hood 43 and the outer surface of the connector housing H is less likely to enter the case 20, even if a capillary phenomenon occurs.

Furthermore, when a gap between the inner surface of the hood 43 and the outer surface of the connector housing H is large, there is a possibility that dust, dirt, or the like will enter the case 20 through the gap. However, because the inward flange 44 is provided, dust, dirt, or the like passing through the gap between the inner surface of the hood 43 and the outer surface of the connector housing H is prevented from entering the case 20. Also, even if a capillary phenomenon occurs, water that has entered between the inner surface of the hood 43 and the outer surface of the connector housing H is less likely to reach the inward flange 44. For this reason, even in a case where the inward flange 44 is provided as in this example, even if there is a small gap between the outer surface of the inward flange 44 and the outer surface of the connector housing H, water is less likely to reach the gap, and thus water is less likely to enter the case 20 through the gap.

Figure 10:
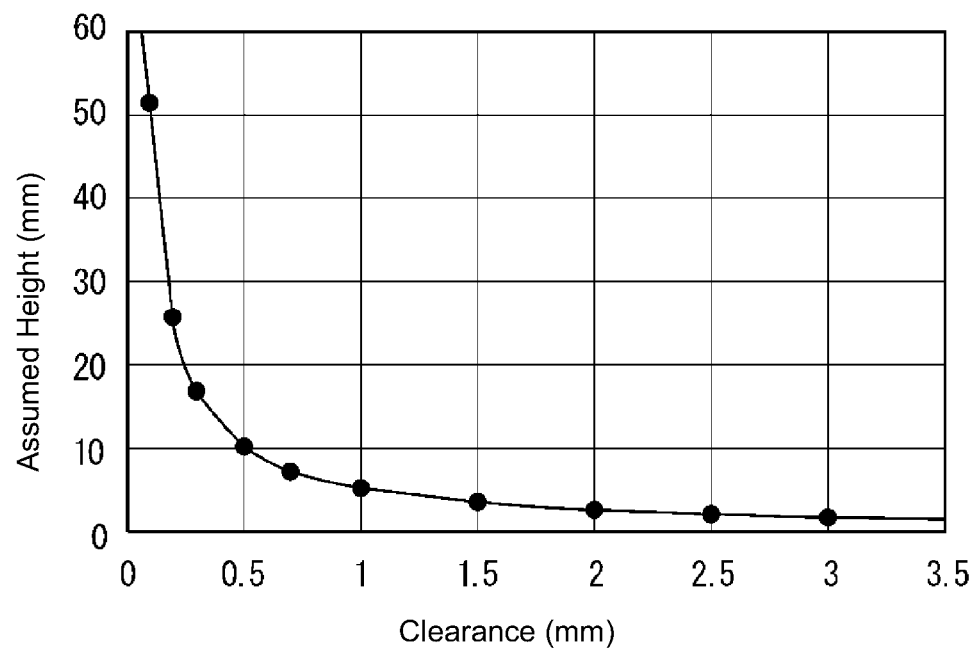
FIG. 10 is a graph showing the relationship between a clearance and an assumed height regarding a capillary phenomenon.

FIG. 10 is a graph showing the relationship between a clearance and an assumed height regarding a capillary phenomenon. The graph shown in FIG. 10 shows a simulation result using Expression (1) of a capillary phenomenon under the following conditions. The material of the circular tube is an ABS resin. The liquid is water. The height is sea level, and the temperature is 20° C.

The upper limit and the lower limit of the clearance in the first clearance portion may be determined as appropriate. If the clearance in the first clearance portion is too large, the size of the electronic unit 10 increases. For this reason, it is preferable that the upper limits of the clearances C1 and C2 in the first clearance portion are as small as possible within an allowable range. The upper limits of the clearances C1 and C2 in the first clearance portion may be any value of 3 to 5 mm, for example. In contrast, if the clearances C1 and C2 in the first clearance portion are too small, the assumed height determined according to Expression (1) of a capillary phenomenon becomes excessively large. For this reason, the lower limits of the clearances C1 and C2 in the first clearance portion may be values at which the assumed height does not become excessively large. The lower limits of the clearances C1 and C2 in the first clearance portion may be set such that the assumed height is lower than 10 mm, 7 mm, or 5 mm, for example.

As described above, the lower limit values of the dimension Z1 and Z2 at which the constant clearances C1 and C2 continue in the first clearance portion can be the assumed heights obtained according to Expression (1) of a capillary phenomenon. The upper limit values of the dimension Z1 and Z2 at which the constant clearances C1 and C2 continue in the first clearance portion may be, for example, the sum of lower limit values and a mm. The value of a may be, for example, 1 mm, 2 mm, or 3 mm. In addition, for example, the upper limit values of the dimensions Z1 and Z2 at which the constant clearances C1 and C2 continue in the first clearance portion may be products of the lower limit values and B. The value of 6 may be, for example, 1.1, 1.2, or 1.3.

In FIG. 10, when the clearances C1 and C2 in the first clearance portion are 1.5 mm or higher, the assumed height is lower than 5 mm. In this case, for example, the clearances C1 and C2 in the first clearance portion may be 1.5 mm or more and 3 mm or lower. Even in a case other than the case shown in FIG. 10, the clearances C1 and C2 in the first clearance portion may be 1.5 mm or more and 3 mm or lower.

Operations

In a case where the case 20 is disposed in a state in which the side wall 22 faces vertically upward, the flow of water when water is applied to the side wall 22 will be considered.

Water flowing along the outer surface of the side wall 22 may proceed from the rear side toward the opening 21 side. The case 20 may be attached, for example, such that the opening 21 faces slightly downward. In this case, water flowing along the outer surface of the side wall 22 advances from the rear side to the opening 21 side. When the water flowing along the outer surface of the side wall 22 advances from the rear side to the opening 21 side, the water first reaches the rear-side protruding portion 52. At this time, because the step S is provided in the rear-side protruding portion 52, the water is blocked by the step S. Water that has passed over the step S provided in the rear-side protruding portion 52 reaches the opening-side protruding portion 50. At this time, because the step S is provided in the opening-side protruding portion 50, the water is blocked by the step S.

The steps S provided in the opening-side protruding portion 50 and the rear-side protruding portion 52 are formed so as to extend along the periphery of the opening 21. Accordingly the water blocked by the steps S proceeds toward the side walls 23 and 24 along the steps S. The water then flows downward along the side walls 23 and 24.

Because each of the side walls 23 and 24 is also provided with a protruding portion 54, the water that has reached the side walls 23 and 24 is blocked by the steps S at the protruding portions 54, and is guided downward. Although the locking portion 28 is located near the protruding portion 54, because the protruding portion 54 protrudes more than the locking portion 28, water is less likely to reach the locking portion 28.

With this configuration, water is less likely to reach the gap between the cover 40 and the case 20 and the gaps between the cover 40 and the connectors C.

Next, a case where some water reaches the gap between the cover 40 and the case 20 and the gaps between the cover 40 and the connectors C will be considered. As described above, the protruding portions 50, 52, and 54 prevent water from reaching the gap between the cover 40 and the case 20 and the gaps between the cover 40 and the connectors C. However, some water may directly reach the gap between the cover 40 and the case 20 and a gap between the cover 40 and the connectors C.

However, because the first clearance portions and the second clearance portions are provided in each of the portion located between the cover 40 and the case 20 and the portions respectively located between the cover 40 and the connectors C, water is less likely to enter the case 20 from the portion located between the cover 40 and the case 20 and the portions respectively located between the cover 40 and the connectors C.

In particular, because the dimension C1 and the dimension Z1 are set to dimensions according to Expression (1), water is less likely to enter from the gap between the cover 40 and the case 20 and move toward the rear side of the cover 40 of the case 20. More specifically when water reaches the gap between the cover 40 and the case 20, the water may proceed to the inside of the case 20 due to a capillary phenomenon. However, because the dimension Z1 is set to be greater than or equal to the assumed height corresponding to the dimension C1, water that has entered between the frame portion 41 and the case 20 is less likely to reach the position of the outward flange 42. Accordingly even if a capillary phenomenon occurs, water is less likely to enter the case 20 from the gap between the cover 40 and the case 20 to the rear side with respect to the cover 40.

Similarly; because the dimension C2 and the dimension Z2 are set to dimensions according to Expression (1), water is less likely to enter the case 20 from the gaps between the cover 40 and the connector housings H and move to the rear side with respect to the cover 40. More specifically when water reaches a gap between the cover 40 and the connector housings H, the water may proceed to the inside of the case 20 due to a capillary phenomenon. However, because the dimension Z2 is set to be greater than or equal to the assumed height corresponding to the dimension C2, water that has entered between the hoods 43 and the connector housings H is less likely to reach the positions of the inward flanges 44. Accordingly even if a capillary phenomenon occurs, water is less likely to enter the case 20 from the gap between the cover 40 and the case 20 and move to the rear side with respect to the cover 40.

As described above, with this configuration, water flowing along the outer surface of the case 20 is less likely to enter the case 20.

Effects and the Like of Embodiment

According to the electronic unit 10 configured as described above, because the first clearance portion having a large clearance is located on the outer side, water is less likely to reach the second clearance portion, even when a capillary phenomenon occurs, and water is prevented from entering the case 20. In addition, because the first clearance portion extends and reaches the second clearance portion while maintaining a constant clearance, there is no need to provide a water pooling portion between the first clearance portion and the second clearance portion, and the electronic unit 10 can be kept compact. As a result, it is possible to increase waterproofness of the electronic unit 10 while making the electronic unit 10 as compact as possible.

Because the first clearance portion and the second clearance portion are provided between the cover 40 and the case 20, it is possible to prevent water from entering the case 20 through the gap between the cover 40 and the case 20. Similarly, because the first clearance portions and the second clearance portions are provided between the cover 40 and the connectors C, it is possible to prevent water from entering the case 20 through the gaps between the cover 40 and the connectors C.

The opening 21 is formed to a size that enables insertion of the circuit board 30, the case 20 is formed in a rectangular parallelepiped box shape, and the opening 21 is formed in a portion corresponding to one surface of the rectangular parallelepiped. Accordingly, it is possible to reduce the region of the case 20 in which the opening 21 is provided.

In addition, when a rising height of a liquid level is assumed to be an assumed height in a capillary phenomenon caused by a combination of water and a circular tube having a diameter of a certain clearance in the first clearance portion, the first clearance portion extends to the second clearance portion by the assumed height or more while maintaining the certain clearance. Accordingly, even if water enters the first clearance portion and a capillary phenomenon occurs, the water is less likely to reach the second clearance portion.

Furthermore, because the protruding portions 50, 52, and 54 are formed on the side walls 22, 23, and 24 of the case 20, water flowing along the side walls 22, 23, and 24 of the case 20 is blocked by the protruding portions 50, 52, and 54, and the water is less likely to reach the gap between the case 20 and the cover 40.

In order to make the electronic unit 10 waterproof, it is conceivable to attach packing or employ a waterproof connector. However, a configuration in this case is expensive and difficult to manufacture. Furthermore, in a place where the risk of water splashing is low, such specifications may be over engineering. In contrast, in the above electronic unit 10, the waterproof properties can be easily provided, and thus the electric unit 10 is effectively disposed in a place where the risk of water splashing is low.

In addition, because the protruding portions 50, 52, and 54 are provided on the three or more side walls 22, 23, and 24 of the case 20, any one of the protruding portions 50, 52, and 54 can be positioned on the side walls 22, 23, and 24 facing upward in the vertical direction, regardless of whether the case 20 is disposed vertically or horizontally. That is to say even when any one of the side walls 22, 23, and 24 is oriented upward in the vertical direction, any of the protruding portions 50, 52, and 54 can be present.

Also, because the protruding portions 50 and 52 are provided on the side wall 22 of the case 20, water flowing along the side wall 22 of the case 20 is likely to be blocked by the protruding portions 50 and 52.

Also, because the first band-shaped protruding portions 55 are provided at positions farther from the opening 21 than the locking portions 28 are, water is less likely to reach the locking portions 28. Accordingly, it is possible to prevent water from entering from gaps in the locking portions 28.

Also, because the first band-shaped protruding portions 55 are provided so as to protrude more outward from the second side walls 23 and 24 than the locking portions 28, water is less likely to reach the locking portions 28.

Also, because the opening-side protruding portion 50 and the second band-shaped protruding portions 56 are provided, the step S in the opening-side protruding portion 50 can be located at a position close to the opening 21. Accordingly even if water is splashed on a portion of the side wall 22 near the opening 21, the water is blocked by the opening-side protruding portion 50.

Also, when the electronic unit 10 is disposed in a vehicle or the like such that the side wall 22 faces upward in the vertical direction, water is likely to flow along the inclined surfaces of the first band-shaped protruding portions 55 and the second band-shaped protruding portions 56. With this configuration, water is likely to flow downward.

MODIFIED EXAMPLES

In the embodiment, a waterproof structure using the first clearance portions and the second clearance portions in both the portion located between the cover 40 and the case 20 and the portions respectively located between the cover 40 and the connectors C is employed. However, this is not an essential configuration. For example, a waterproof structure using the first clearance portions and the second clearance portions in only on one of the portion located between the cover 40 and the case 20 and the portions respectively located between the cover 40 and the connectors C may be employed. That is to say, a waterproof structure using the first clearance portions and the second clearance portions in at least one of the portion located between the cover 40 and the case 20 and the portions respectively located between the cover 40 and the connectors C may be employed.

In the embodiment, the case 20 is formed in a rectangular parallelepiped box shape, but this is not an essential configuration. The case 20 may be formed in another shape.

In the embodiment, the combination of the dimension C1 and the dimension Z1 and the combination of the dimension C2 and the dimension Z2 are described as being determined in accordance with Expression (1) regarding a capillary phenomenon, but this is not an essential configuration. The combination of the dimension C1 and the dimension Z1 and the combination of the dimension C2 and the dimension Z2 may be determined without using Expression (1) regarding a capillary phenomenon, and may be experimentally obtained, for example.

In the embodiment, the plurality of connectors C exposed to the outside through the opening 21 and the through holes are provided, but this is not an essential configuration. Only one connector C exposed to the outside through the opening 21 and the through hole may be provided.

The waterproof structure using the steps S is provided on the outer surface of the case 20, but this is not an essential configuration. The waterproof structure using the steps S may be omitted. In this case, the outer surface of the case 20 may be flat.

The configurations described in the embodiment and the modified examples can be appropriately combined as long as they do not contradict each other.

The invention claimed is:

1. An electronic unit comprising:
a case including an opening;
a circuit board housed in the case; and
a cover attached to the opening, the cover including a hood having a through hole,
wherein a connector is provided on the circuit board,
a portion of the connector to be connected to a mating connector is exposed to the outside through the through hole,
a set of a first clearance portion and a second clearance portion is provided in a first position located between the cover and the case at a position of the opening and is continuous with the opening, the set of the first clearance portion and the second clearance portion is provided in a second position located between the cover and the connector at a position of the through hole and is continuous with the through hole, or the set of the first clearance portion and the second clearance portion is provided in each of the first position and the second position,
a clearance in the first clearance portion is larger than a clearance in the second clearance portion,
the second clearance portion is located on an inner side of the case relative to the first clearance portion in a direction in which the circuit board is inserted into the case through the opening, and
the first clearance portion extends and reaches the second clearance portion while maintaining a constant clearance.

2. The electronic unit according to claim 1, wherein the first clearance portion and the second clearance portion are provided in the portion located between the cover and the case at the position of the opening.

3. The electronic unit according to claim 2, wherein the first clearance portion and the second clearance portion are provided in the portion located between the cover and the connector at the position of the through hole.

4. The electronic unit according to claim 2, wherein the opening is formed to have a size into which the circuit board is insertable, and the case is formed in a rectangular parallelepiped box shape, and the opening is formed in a portion corresponding to one surface of the rectangular parallelepiped.

5. The electronic unit according to claim 2, wherein, when a rising height of a liquid level is defined as an assumed height regarding a capillary phenomenon caused by a combination of water and a circular tube having a diameter of the constant clearance, and the first clearance portion extends to the second clearance portion by the assumed height or more while maintaining the constant clearance.

6. The electronic unit according to claim 1, wherein the first clearance portion and the second clearance portion are provided in the portion located between the cover and the connector at the position of the through hole.

7. The electronic unit according to claim 6, wherein the opening is formed to have a size into which the circuit board is insertable, and the case is formed in a rectangular parallelepiped box shape, and the opening is formed in a portion corresponding to one surface of the rectangular parallelepiped.

8. The electronic unit according to claim 6, wherein, when a rising height of a liquid level is defined as an assumed height regarding a capillary phenomenon caused by a combination of water and a circular tube having a diameter of the constant clearance, and the first clearance portion extends to the second clearance portion by the assumed height or more while maintaining the constant clearance.

9. The electronic unit according to claim 1, wherein the opening is formed to have a size into which the circuit board is insertable, and the case is formed in a rectangular parallelepiped box shape, and the opening is formed in a portion corresponding to one surface of the rectangular parallelepiped.

10. The electronic unit according to claim 9, wherein, when a rising height of a liquid level is defined as an assumed height regarding a capillary phenomenon caused by a combination of water and a circular tube having a diameter of the constant clearance, and the first clearance portion extends to the second clearance portion by the assumed height or more while maintaining the constant clearance.

11. The electronic unit according to claim 1, wherein, when a rising height of a liquid level is defined as an assumed height regarding a capillary phenomenon caused by a combination of water and a circular tube having a diameter of the constant clearance, and the first clearance portion extends to the second clearance portion by the assumed height or more while maintaining the constant clearance.

* * * * *